(12) United States Patent
Busse et al.

(10) Patent No.: US 8,653,817 B2
(45) Date of Patent: Feb. 18, 2014

(54) ACCELERATED PSEUDO-RANDOM DATA MAGNETIC RESONANCE IMAGING SYSTEM AND METHOD

(75) Inventors: Reed Frederick Busse, Madison, WI (US); James Holmes, Madison, WI (US); Philip James Beatty, Thornhill (CA); Kang Wang, Madison, WI (US); Frank Korosec, Middleton, WI (US)

(73) Assignee: General Electric Company, Schenectady, NY (US)

( * ) Notice: Subject to any disclaimer, the term of this patent is extended or adjusted under 35 U.S.C. 154(b) by 227 days.

(21) Appl. No.: 13/051,952

(22) Filed: Mar. 18, 2011

(65) Prior Publication Data

US 2011/0241677 A1 Oct. 6, 2011

Related U.S. Application Data

(60) Provisional application No. 61/320,682, filed on Apr. 2, 2010, provisional application No. 61/325,234, filed on Apr. 16, 2010.

(51) Int. Cl.
*G01V 3/00* (2006.01)

(52) U.S. Cl.
USPC .......................................... 324/309; 324/307

(58) Field of Classification Search
USPC ............................ 324/300–322; 600/407–445
See application file for complete search history.

(56) References Cited

U.S. PATENT DOCUMENTS

| | | | |
|---|---|---|---|
| 4,652,832 A * | 3/1987 | Jasper | 327/106 |
| 5,031,624 A | 7/1991 | Mistretta et al. | |
| 5,204,627 A | 4/1993 | Mistretta et al. | |
| 5,285,158 A | 2/1994 | Mistretta et al. | |
| 5,713,358 A | 2/1998 | Mistretta et al. | |
| 5,814,992 A | 9/1998 | Busse-Grawitz et al. | |
| 5,830,143 A | 11/1998 | Mistretta et al. | |
| 5,873,825 A | 2/1999 | Mistretta et al. | |
| 5,881,728 A | 3/1999 | Mistretta et al. | |
| 6,009,130 A * | 12/1999 | Lurey et al. | 375/347 |
| 6,044,290 A | 3/2000 | Vigen et al. | |
| 6,278,273 B1 | 8/2001 | Riederer et al. | |
| 6,462,545 B1 | 10/2002 | Busse et al. | |
| 6,487,435 B2 | 11/2002 | Mistretta et al. | |
| 6,956,374 B2 | 10/2005 | Busse | |
| 7,276,904 B2 | 10/2007 | Busse et al. | |

(Continued)

OTHER PUBLICATIONS

Haider CR, Hu HH, Campeau NG, Huston J, 3rd, Riederer SJ. "3D high temporal and spatial resolution contrast-enhanced MR angiography of the whole brain." Magn Reson Med 2008;60(3):749-760.

(Continued)

*Primary Examiner* — Brij Shrivastav
(74) *Attorney, Agent, or Firm* — Fletcher Yoder, P.C.

(57) ABSTRACT

The present disclosure is intended to describe embodiments for improving image data acquisition and processing in accelerated dynamic magnetic resonance imaging sequences. One embodiment is described where a method includes an acquisition sequence configured to acquire an undersampled set of magnetic resonance data. The undersampled set of magnetic resonance data has a pseudo-random sampling pattern within a data space acquired at a first time, the pseudo-random sampling pattern being influenced by other pseudo-random sampling patterns within the data space arising from the acquisition of additional undersampled sets of magnetic resonance data at respective times. In some embodiments, the pseudo-random sampling patterns of the undersampled sets of magnetic resonance data interleave to yield a desired sampling pattern.

22 Claims, 8 Drawing Sheets

(56) References Cited

U.S. PATENT DOCUMENTS

| | | | |
|---|---|---|---|
| 7,282,917 B1 | 10/2007 | Brau et al. | |
| 7,284,141 B2* | 10/2007 | Stickle | 713/400 |
| 7,439,739 B2 | 10/2008 | Beatty | |
| 7,486,075 B2 | 2/2009 | Brau et al. | |
| 7,492,153 B2 | 2/2009 | Brau et al. | |
| 7,508,212 B2 | 3/2009 | Fain et al. | |
| 7,519,412 B2 | 4/2009 | Mistretta | |
| 7,619,410 B2 | 11/2009 | Beatty et al. | |
| 7,649,354 B2 | 1/2010 | Bayram et al. | |
| 7,659,718 B1 | 2/2010 | Lustig et al. | |
| 7,688,068 B2 | 3/2010 | Beatty | |
| 7,692,425 B2 | 4/2010 | Brau et al. | |
| 7,714,581 B2 | 5/2010 | Erickson et al. | |
| 7,768,264 B1 | 8/2010 | Brau et al. | |
| 7,800,368 B2* | 9/2010 | Vaughan et al. | 324/318 |
| 7,804,299 B2 | 9/2010 | Reeder et al. | |
| 7,821,264 B2 | 10/2010 | Koch et al. | |
| 7,821,265 B2 | 10/2010 | Busse | |
| 7,973,532 B2 | 7/2011 | Forgang et al. | |
| 7,991,452 B2 | 8/2011 | Mistretta et al. | |
| 7,994,785 B2 | 8/2011 | Fain et al. | |
| 8,000,773 B2* | 8/2011 | Rousso et al. | 600/436 |
| 8,111,810 B2 | 2/2012 | Zagzebski et al. | |
| 8,111,893 B2 | 2/2012 | Chen et al. | |
| 8,116,541 B2 | 2/2012 | Brau et al. | |
| 8,120,360 B2 | 2/2012 | Saranathan et al. | |
| 8,170,315 B2 | 5/2012 | Mistretta et al. | |
| 8,175,359 B2 | 5/2012 | O'Halloran et al. | |
| 8,194,937 B2 | 6/2012 | Chen | |
| 8,228,060 B2 | 7/2012 | Busse | |
| 8,229,199 B2 | 7/2012 | Chen et al. | |
| 8,326,054 B2 | 12/2012 | Chen et al. | |
| 8,334,695 B2 | 12/2012 | McColl et al. | |
| 8,354,844 B2 | 1/2013 | Zaitsev et al. | |
| 8,374,413 B2 | 2/2013 | Chen | |
| 8,378,680 B2* | 2/2013 | Grinstead et al. | 324/309 |
| 2005/0001617 A1 | 1/2005 | Busse | |
| 2006/0267584 A1 | 11/2006 | Busse et al. | |
| 2007/0279061 A1 | 12/2007 | Erickson et al. | |
| 2008/0012562 A1 | 1/2008 | Beatty | |
| 2008/0024132 A1 | 1/2008 | Brau et al. | |
| 2008/0231281 A1 | 9/2008 | Fain et al. | |
| 2008/0275329 A1 | 11/2008 | Reeder et al. | |
| 2008/0279433 A1 | 11/2008 | Brau et al. | |
| 2008/0297152 A1 | 12/2008 | Brau et al. | |
| 2008/0303521 A1 | 12/2008 | Beatty et al. | |
| 2008/0319301 A1 | 12/2008 | Busse | |
| 2009/0082656 A1 | 3/2009 | Bayram et al. | |
| 2009/0134872 A1 | 5/2009 | Brau et al. | |
| 2009/0184711 A1 | 7/2009 | Koch et al. | |
| 2009/0224757 A1 | 9/2009 | Busse | |
| 2009/0273344 A1 | 11/2009 | Fain et al. | |
| 2009/0278539 A1 | 11/2009 | Beatty | |
| 2010/0244825 A1 | 9/2010 | Brau et al. | |
| 2011/0181283 A1* | 7/2011 | Grinstead et al. | 324/309 |
| 2011/0241669 A1 | 10/2011 | Chen et al. | |
| 2011/0241670 A1 | 10/2011 | Lai et al. | |
| 2011/0241676 A1 | 10/2011 | Busse et al. | |
| 2012/0172715 A1 | 7/2012 | MacGregor et al. | |
| 2012/0206140 A1 | 8/2012 | Banerjee et al. | |
| 2012/0212222 A1 | 8/2012 | Subramanian et al. | |
| 2012/0262172 A1 | 10/2012 | Holmes et al. | |
| 2013/0038326 A1* | 2/2013 | Amadon et al. | 324/309 |

OTHER PUBLICATIONS

Haider CR, Glockner JF, Vrtiska TJ, Macedo TA, Borisch EA, Riederer SJ. "A Comparison of Time-Resolved 3D CE-MRA with Peripheral Run-off CTA in the Calves." MR Angio Club. East Lansing, MI; 2009.

Du J. "Contrast-enhanced MR angiography using time resolved interleaved projection sampling with three-dimensional cartesian phase and slice encoding (TRIPPS)." Magn Reson Med 2009;61(4):918-924. Published Online Feb. 4, 2009.

Lustig M, Donoho D, Pauly JM. Sparse MRI: "The application of compressed sensing for rapid MR imaging." Magn Reson Med 2007;58(6):1182-1195.

Busse RF, Wang K, Holmes JH, Brittain JH, Korosec FR. "Optimization of Variable-Density Cartesian Sampling for Time-Resolved Imaging." In: Proc 17th Annual Meeting ISMRM; Hawai'i, USA 2009:4534 (Meetings Apr. 18-24, 2009).

Du J, Carroll TJ, Brodsky E, Lu A, Grist TM, Mistretta CA, Block WF. "Contrast-enhanced peripheral magnetic resonance angiography using time-resolved vastly undersampled isotropic projection reconstruction." J Magn Reson Imaging 2004;20(5):894-900.

Keith L, Kecskemeti S, Velikina J, Mistretta C. "Simulation of relative temporal resolution of time-resolved MRA sequences." Magn Reson Med 2008;60(2):398-404.

Busse RF, Pineda AR, Wang K, Holmes JH, Brittain JH, Korosec FR. "Time-Resolved Imaging with Multiplicative Algebraic Reconstruction Technique (MART): An Application of HYPR Principles for Variable Density Cartesian Acquisitions." In: Proc 17th Annual Meeting ISMRM; Hawai'i, USA 2009:2834 (Meetings Apr. 18-24, 2009).

Chandra S, Liang ZP, Webb A, Lee H, Morris HD, Lauterbur PC. "Application of reduced-encoding imaging with generalized-series reconstruction (RIGR) in dynamic MR imaging." J Magn Reson Imaging 1996;6(5):783-797.

Tsao J, Boesiger P, Pruessmann KP. "k-t BLAST and k-t SENSE: dynamic MRI with high frame rate exploiting spatiotemporal correlations." Magn Reson Med 2003;50(5):1031-1042.

Candes EJ, Romberg J, Tao T. "Robust uncertainty principles: Exact signal reconstruction from highly incomplete frequency information." IEEE Transactions on Information Theory 2006;52(2):489-509.

Donoho DL. "Compressed sensing." IEEE Transactions on Information Theory 2006;52(4):1289-1306.

Mistretta CA, Wieben O, Velikina J, Block W, Perry J, Wu Y, Johnson K, Wu Y. "Highly constrained backprojection for time-resolved MRI." Magn Reson Med 2006;55(1):30-40.

Johnson KM, Velikina J, Wu Y, Kecskemeti S, Wieben O, Mistretta CA. "Improved waveform fidelity using local HYPR reconstruction (HYPR LR)." Magn Reson Med 2008;59(3):456-462.

Wu Y, Johnson K, Wieben O, Velikina J, Carrillo A, Kecskemeti S, Mistretta C, Korosec F. "Comparison of HYPR Stack-of-Stars and HYPR VIPR to TRICKS in Peripheral CE MRA." In: Proc 16th Annual Meeting ISMRM; Toronto, USA 2008:108.

Wang K, Du J, Wu Y, Busse RF, Johnson K, Korosec FR. "Accelerated 3D Time-Resolved MR Angiography using Cartesian HYPR LR Reconstruction." In: Proc 17th Annual Meeting ISMRM; Hawai'i, USA 2009:3884 (Meetings Apr. 18-24, 2009).

Huang Y, Wright GA. "Time-resolved MR angiography with limited projections." Magn Reson Med 2007;58(2):316-325.

Griswold MA, Jakob PM, Heidemann RM, Nittka M, Jellus V, Wang J, Kiefer B, Haase A. "Generalized autocalibrating partially parallel acquisitions (GRAPPA)." Magn Reson Med 2002;47(6):1202-1210.

Brau AC, Beatty PJ, Skare S, Bammer R. "Comparison of reconstruction accuracy and efficiency among autocalibrating data-driven parallel imaging methods." Magn Reson Med 2008;59(2):382-395.

Pruessmann KP, Weiger M, Scheidegger MB, Boesiger P. "Sense: sensitivity encoding for fast MRI." Magn Reson Med 1999;42(5):952-962.

Peters DC, Korosec FR, Grist TM, Block WF, Holden JE, Vigen KK, Mistretta CA. "Undersampled projection reconstruction applied to MR angiography." Magn Reson Med 2000;43(1):91-101.

Barger AV, Block WF, Toropov Y, Grist TM, Mistretta CA. "Time-resolved contrast-enhanced imaging with isotropic resolution and broad coverage using an undersampled 3D projection trajectory." Magn Reson Med 2002;48(2):297-305.

Jeong HJ, Cashen TA, Hurley MC, Eddleman C, Getch C, Batjer HH, Carroll TJ. "Radial sliding-window magnetic resonance angiography (MRA) with highly-constrained projection reconstruction (HYPR)." Magn Reson Med 2009;61(5):1103-1113. Published online Feb. 19, 2009 per publisher website.

Gordon, J "Algebraic Reconstruction Techniques (ART) for Three-dimensional Electron Microscopy and X-ray Photography," Theor Biol, 1970; 29:471-481.

(56) References Cited

OTHER PUBLICATIONS

O'Halloran, "Iterative Projection Reconstruction of Time-Resolved Images Using Highly-Constrained Back-Projection (HYPR)," Magnetic Resonance in Medicine, 2008; 59:132-139.

Wu, "Clinical Experience of HYPR Flow," Proc. Intl. Soc. Mag. Reson. Med. 16 (2008) p. 110.

Haider, "Highly Accelerated 2D GRAPPA by Randomized K-Space Sampling," Proc. Intl. Soc. Mag. Reson. Med. 16 (2008), p. 1271.

Hu et al., "Combination of 2D Sensitivity Encoding and 2D Partial Fourier Techniques for Improved Acceleration in 3D Contrast-Enhanced MR Angiography," Magnetic Resonance in Medicine 55:16 (2006).

Korosec et al. "Time-Resolved Contrast-Enhanced 3D MR Angiography," Magnetic Resonance in Medicine 1996;36:345-351.

Liang et al., "An Efficient Method for Dynamic Magnetic Resonance Imaging," IEEE Trans. Med. Imaging, 1994; 13: 677-686.

Kim et al. "Accelerated Three-Dimensional Upper Airway MRI Using Compressed Sensing," Magnetic Resonance in Medicine 61:1434-1440 (2009). Published online Apr. 7, 2009.

van Vaals, "Keyhole Method for Accelerating Imaging of Contrast Agent Uptake," Journal of Magnetic Resonance Imaging 3:671 (1993).

Doyle et al., "Block Regional Interpolation Scheme for k-Space (BRISK): A Rapid Cardiac Imaging Technique," Magnetic Resonance in Medicine 33:163 (1995).

Madhuranthakam et al., "Time-Resolved 3D Contrast-Enhanced MRA of an Extended FOV Using Continuous Table Motion," Magnetic Resonance in Medicine 51:568 (2004).

Rasche et al., "Continuous Radial Data Acquisition for Dynamic MRI," Magnetic Resonance in Medicine 34:754 (1995).

Liu et al., "Generation and Visualization of Four-Dimensional MR Angiography Data Using an Undersampled 3-D Projection Trajectory." IEEE Transactions on Medical Imaging 25:148 (2006).

Youla and Webb, "Image Restoration by the Method of Convex Projections: Part 1—Theory", IEEE Trans. on Med. Imaging, 2, 81-94, Oct. 1982.

M. I. Sezan and H. Stark, "Image Restoration by the Method of Convex Projections: Part 2—Applications and Numerical Results" IEEE Transactions on Medical Imaging, vol. MI-1, No. 2, Oct. 1982.

Haider et al., "3D High Temporal and Spatial Resolution Contrast-Enhanced MR Angiography of the Whole Brain." Magnetic Resonance in Medicine 60:749-760 (2008).

Saranathan et al., "Differential Subsampling With Cartesian Ordering (DISCO): A High Spatio-temporal Resolution Dixon Imaging Sequence for Multiphasic Contrast Enhanced Abdominal Imaging." Journal of Magnetic Resonance Imaging 35:1484-1492 (2012).

Bauschke et al., "On Projection Algorithms for Solving Convex Feasibility Problems." Society for Industrial and Applied Mathematics (SIAM) Review, vol. 38, No. 3, pp. 367-426, Sep. 1996.

* cited by examiner

ACCELERATED PSEUDO-RANDOM DATA MAGNETIC RESONANCE IMAGING SYSTEM AND METHOD

CROSS-REFERENCE TO RELATED APPLICATIONS

This application claims the benefit of U.S. Provisional Patent Application Ser. No. 61/320,682 by Busse et al., entitled "SYSTEM AND METHOD FOR TIME RESOLVED MAGNETIC RESONANCE (MR) IMAGING," filed on Apr. 2, 2010, and the benefit of U.S. Provisional Patent Application Ser. No. 61/325,234 by Busse et al., entitled "SYSTEM AND METHOD FOR MAGNETIC RESONANCE (MR) IMAGING," filed on Apr. 16, 2010, both of which are herein incorporated by reference in their entirety.

STATEMENT REGARDING FEDERALLY SPONSORED RESEARCH AND DEVELOPMENT

This invention was made with government support under EB006882 awarded by the National Institutes of Health. The government may have certain rights in the invention.

BACKGROUND

The present invention relates to magnetic resonance imaging data collection and processing, and more specifically, to methods for accelerating magnetic resonance data collection and synthesizing images from the collected data.

In general, magnetic resonance imaging (MRI) examinations are based on the interactions among a primary magnetic field, a radiofrequency (RF) magnetic field and time varying magnetic gradient fields with gyromagnetic material having nuclear spins within a subject of interest, such as a patient. Certain gyromagnetic materials, such as hydrogen nuclei in water molecules, have characteristic behaviors in response to external magnetic fields. The precession of spins of these nuclei can be influenced by manipulation of the fields to produce RF signals that can be detected, processed, and used to reconstruct a useful image.

The magnetic fields used to generate images in MRI systems include a highly uniform, static magnetic field that is produced by a primary magnet. A series of gradient fields are produced by a set of gradient coils located around the subject. The gradient fields encode positions of individual plane or volume elements (pixels or voxels) in two or three dimensions. An RF coil is employed to produce an RF magnetic field. This RF magnetic field perturbs the spins of some of the gyromagnetic nuclei from their equilibrium directions, causing the spins to precess around the axis of their equilibrium magnetization. During this precession, RF fields are emitted by the spinning, precessing nuclei and are detected by either the same transmitting RF coil, or by a separate coil. These signals are amplified, filtered, and digitized. The digitized signals are then processed using one or more algorithms to reconstruct a useful image.

Techniques have been developed to perform MRI imaging sequences quickly, so as to avoid long breath holds required of patients, to obtain images of rapidly changing anatomies (e.g., the beating heart), and/or to monitor the flow of one or more fluids (e.g., contrast agents) through various anatomies. Some such techniques acquire less than all of the information normally utilized for image reconstruction, requiring that the absent data be estimated in some way for proper, high quality image creation. However, current techniques for such estimation are often inadequate or subject to further improvement. For example, it is often difficult to obtain temporal and spatial resolution using accelerated imaging techniques that is sufficient for diagnostic purposes. Accordingly, it is now recognized that a need exists for improved methods for data acquisition, estimation, and reconstruction in time-resolved magnetic resonance imaging techniques.

BRIEF DESCRIPTION OF EMBODIMENTS

The present disclosure includes embodiments for improving image data acquisition and processing in such cases. For example, in one embodiment, a magnetic resonance imaging method is provided that includes performing a magnetic resonance dynamic imaging sequence. The sequence includes a first acquisition configured to acquire a first set of magnetic resonance data at a first time, the first set of magnetic resonance data having a first pseudo-random data undersampling pattern defined within an area of a data space, and one or more additional acquisitions configured to acquire one or more additional sets of magnetic resonance data at respective times, each acquisition having second pseudo-random data undersampling patterns defined within the area of the data space. The first and the one or more additional pseudo-random data undersampling patterns interleave to yield a desired sampling pattern and the magnetic resonance data is representative of a feature within a subject of interest.

In another embodiment, a magnetic resonance imaging method is provided including performing a magnetic resonance dynamic imaging sequence. The sequence includes an acquisition sequence configured to acquire an undersampled set of magnetic resonance data having a pseudo-random sampling pattern within a data space at a first time. The pseudo-random sampling pattern is influenced by other pseudo-random sampling patterns within the data space arising from the acquisition of additional undersampled sets of magnetic resonance data at respective times. The first time and the respective times defining a time window. The method also includes generating a series of images from the undersampled magnetic resonance data sets, and generating a reconstructed image using the series of images and a multiplicative constrained reconstruction process.

In another embodiment, a magnetic resonance imaging method is provided that includes performing a magnetic resonance dynamic imaging sequence. The sequence includes a first acquisition sequence including the steps of defining at least a portion of a data space with a uniform pattern of locations that are to be sampled and locations that are not to be sampled and sampling the uniform pattern within the data space in a first pseudo-random subsampling pattern to collect a first set of magnetic resonance data. The dynamic imaging sequence also includes one or more additional acquisition sequences including the step of sampling the uniform pattern within the data space with one or more additional pseudo-random subsampling patterns to collect one or more additional sets of magnetic resonance data. The first and the one or more additional pseudo-random subsampling patterns interleave to yield a desired sampling pattern.

In another embodiment, a magnetic resonance imaging method is provided. The method includes performing parallel imaging reconstruction on a set of magnetic resonance data to generate an initial image. The set of magnetic resonance data includes data acquired in a time frame of interest and having a non-uniform sampling pattern on a predefined area of a data space.

In another embodiment, a magnetic resonance imaging method is provided that includes performing a magnetic resonance acquisition sequence. The acquisition sequence includes defining a uniform undersampling pattern having locations that are to be sampled and locations that are to be left unsampled on at least a portion of a phase encoding plane of a data space. The acquisition also includes acquiring an undersampled set of magnetic resonance data representative of a feature of a subject of interest using a non-uniform undersampling pattern on the defined uniform undersampling pattern.

In a further embodiment, a magnetic resonance imaging method is provided including performing multiplicative constrained reconstruction on an undersampled set of magnetic resonance data acquired within a timeframe of interest to generate a desired image. The data includes an undersampling pattern having locations that are sampled and locations that are not sampled along a phase encoding plane of a data space.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION OF EMBODIMENTS

Figure 1:
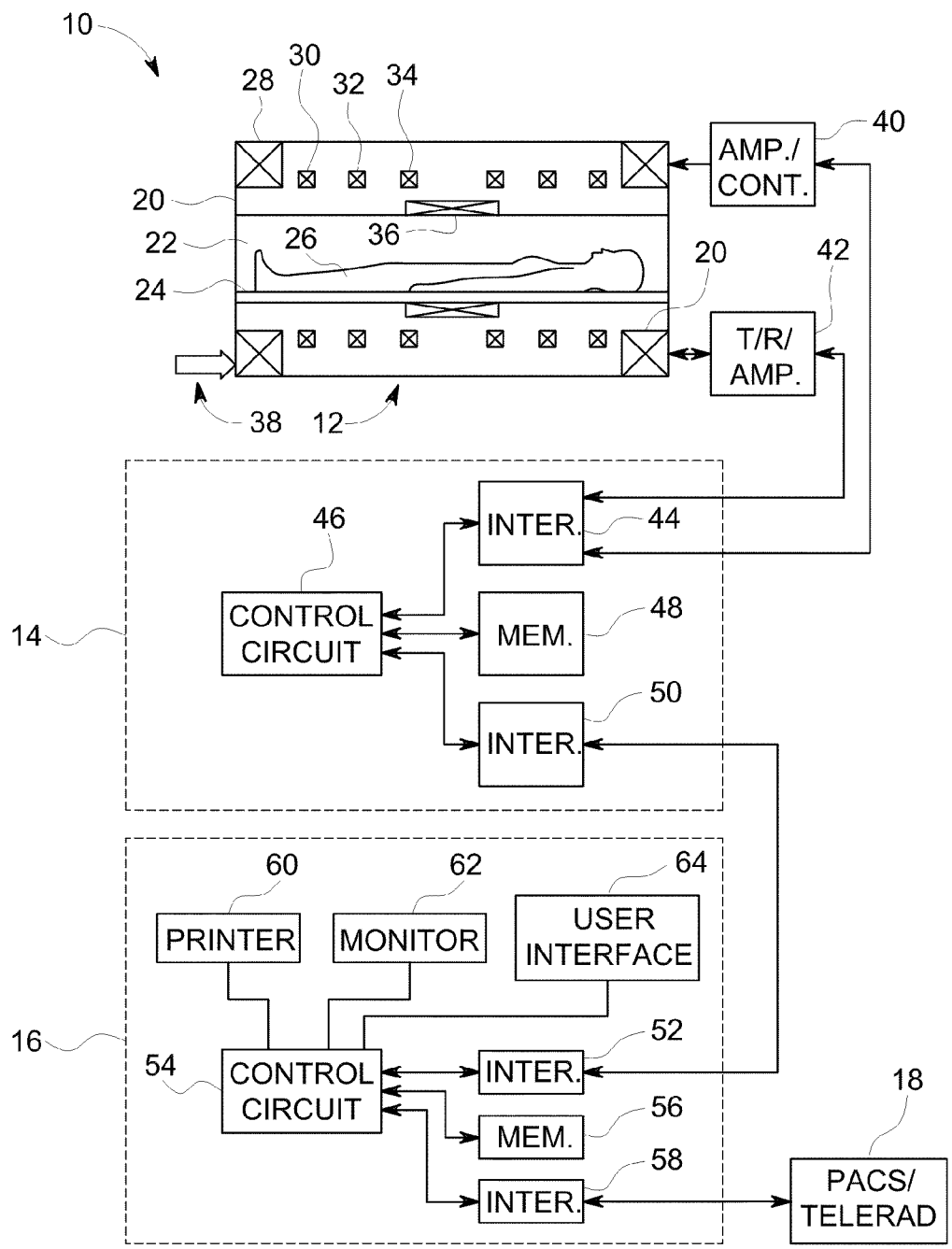
FIG. 1 is a diagrammatic illustration of an embodiment of a magnetic resonance imaging system configured to perform the data acquisition and image reconstruction described herein.

The embodiments described herein may be performed by a magnetic resonance imaging (MRI) system, wherein specific imaging routines (e.g., accelerated imaging routines for dynamic MRI sequences) are initiated by a user (e.g., a radiologist). Further, the MRI system may perform data acquisition, data construction, and image synthesis. Accordingly, referring to FIG. 1, a magnetic resonance imaging system 10 is illustrated schematically as including a scanner 12, a scanner control circuit 14, and a system control circuitry 16. According to the embodiments described herein, the MRI system 10 is generally configured to perform MR imaging, such as accelerated imaging sequences. System 10 additionally includes remote access and storage systems or devices as picture archiving and communication systems (PACS) 18, or other devices such as teleradiology equipment so that data acquired by the system 10 may be accessed on- or off-site. In this way, acquired data may be acquired, followed by on- or off-site processing and evaluation. While the MRI system 10 may include any suitable scanner or detector, in the illustrated embodiment, the system 10 includes a full body scanner 12 having a housing 20 through which a bore 22 is formed. A table 24 is moveable into the bore 22 to permit a patient 26 to be positioned therein for imaging selected anatomy within the patient.

Scanner 12 includes a series of associated coils for producing a controlled magnetic field and for detecting emissions from gyromagnetic material within the anatomy of the subject being imaged. A primary magnet coil 28 is provided for generating a primary magnetic field generally aligned with the bore 22. A series of gradient coils 30, 32, and 34 permit controlled magnetic gradient fields to be generated during examination sequences. A radio frequency (RF) coil 36 is provided for generating radio frequency pulses for exciting the gyromagnetic material, such as for spin perturbation or slice selection. A separate receiving coil or the same RF coil 36 may receive magnetic resonance signals from the gyromagnetic material during examination sequences.

The various coils of scanner 12 are controlled by external circuitry to generate the desired field and pulses, and to read emissions from the gyromagnetic material in a controlled manner. In the illustrated embodiment, a main power supply 38 is provided for powering the primary field coil 28. Driver circuit 40 is provided for pulsing the gradient field coils 30, 32, and 34. Such a circuit typically includes amplification and control circuitry for supplying current to the coils as defined by digitized pulse sequences output by the scanner control circuit 14. Another control circuit 42 is provided for regulating operation of the RF coil 36. Circuit 42 will typically include a switching device for alternating between the active and passive modes of operation, wherein the RF coils transmits and receives signals, respectively. Circuit 42 also includes amplification circuitry for generating the RF pulses and for processing received magnetic resonance signals.

Scanner control circuit 14 includes an interface circuit 44 which outputs signals for driving the gradient field coils and the RF coil and for receiving the data representative of the magnetic resonance signals produced in examination sequences. The interface circuit 44 is coupled to a control circuit 46. The control circuit 46 executes the commands for driving the circuit 42 and circuit 40 based on defined protocols selected via system control circuit 16. Control circuit 46 also serves to receive the magnetic resonance signals and performs subsequent processing before transmitting the data to system control circuit 16. Scanner control circuit 14 also includes one or more memory circuits 48 which store configuration parameters, pulse sequence descriptions, examination results, and so forth, during operation. Interface circuit 50 is coupled to the control circuit 46 for exchanging data between scanner control circuit 14 and system control circuit 16. Such data will typically include selection of specific examination sequences to be performed, configuration parameters of these sequences, and acquired data (e.g., undersampled data) which may be transmitted in raw or processed form from scanner control circuit 14 for subsequent processing, storage, transmission and display.

System control circuit 16 includes an interface circuit 52 which receives data from the scanner control circuit 14 and transmits data and commands back to the scanner control circuit 14. The interface circuit 52 is coupled to a control circuit 54 which may include a CPU in a multi-purpose or application specific computer or workstation. Control circuit 54 is coupled to a memory circuit 56 to store programming code for operation of the MRI system 10 and to store the processed image data for later reconstruction, display and transmission. For example, the programming code may execute one or more algorithms capable of performing accelerated imaging sequences and processing undersampled image data, which will be discussed in detail below. An additional interface circuit 58 may be provided for exchanging image data, configuration parameters, and so forth with external system components such as remote access and storage devices 18. Finally, the system control circuit 54 may include various peripheral devices for facilitating operator interface and for producing hard copies of the reconstructed images. In the illustrated embodiment, these peripherals include a printer 60, a monitor 62, and user interface 64 including devices such as a keyboard or a mouse.

Scanner 12 and the control circuit 46 associated therewith produce magnetic fields and radio frequency pulses in a controlled manner to excite and encode specific gyromagnetic material within the patient 26. The scanner 12 and control circuit 46 also sense the signals emanating from such material and create an image of the material being scanned. In certain embodiments, the scan may be an accelerated scan resulting in an array of undersampled image data sets. It should be noted that the MRI system described is merely intended to be exemplary only, and other system types, such as so-called "open" MRI systems may also be used. Similarly, such systems may be rated by the strength of their primary magnet, and any suitably rated system capable of carrying out the data acquisition and processing described below may be employed.

Specifically, aspects of the present disclosure include methods for accelerating the acquisition of magnetic resonance data and the processing of such data to construct a desired (e.g., a computationally and/or diagnostically-useful) image. At least a portion of the disclosed methods may be performed by the system 10 described above with respect to FIG. 1. That is, the MRI system 10 may perform the acquisition techniques described herein, and, in some embodiments, the data processing techniques described herein. It should be noted that subsequent to the acquisitions described herein, the system 10 may simply store the acquired data for later access locally and/or remotely, for example in a memory circuit (e.g., memory 56). Thus, when accessed locally and/or remotely, the acquired data may be manipulated by one or more processors contained within an application-specific or general purpose computer. The one or more processors may access the acquired data and execute routines including the image processing and reconstruction methods described herein.

The acquisitions in accordance with present embodiments, in a general sense, include acquisitions performed over time to generate a time series of images wherein an anatomy of interest is imaged for one or more physiological characteristics, such as contrast agent diffusion through the anatomies or normal physiological functions (e.g., the beating of a heart). The time series of images may be arranged by time frames, which may estimate a still frame within the dynamic imaging sequence. To allow such imaging sequences to achieve sufficient temporal resolution (i.e., to reduce blurring due to the movement of the anatomies or the flow of contrast agent), and because the acquisition of a time frame is not instantaneous, the disclosed sequences are accelerated by acquiring less than the total amount of data along the $k_y$ and $k_z$ axes of the data space in each time frame, each time frame having locations within data space that are sampled and locations that are not sampled. As opposed to radial acquisitions, performing undersampling on Cartesian systems (i.e., along the $k_y$ and $k_z$ axes) may provide a number of advantages, such as less sensitivity to gradient timing errors, the ability to tailor field of view (FOV) in three dimensions, and may be more suitable for use in combination with parallel imaging techniques. Additionally, the pattern of the locations for each time frame is pseudo-random. In some embodiments, an area proximate the center of the data space is fully acquired. In accordance with certain embodiments, the patterns of the locations acquired may interleave (e.g., in k-space and in time) such that when combined, a desired pattern is produced, as will be described below. Furthermore, while the present embodiments are disclosed in the context of time series, that the approaches described herein are applicable to any series of images wherein less than the total amount of data may be acquired for a given frame or set of data.

It should be noted that the term "pseudo-random" may refer to a random sampling of data in at least a portion of either k-space or hybrid space (i.e., along the phase encode plane of the data space) and that is determined by the sampling pattern at other times in a sequence of image data acquisition. In certain presently contemplated embodiments, the combined sampling performed at multiple times (at least two) results in certain desired sampling coverage (and hence, the sampling is determined by the inter-relationship between acquisitions, so is not fully random). As an example, the desired sampling coverage resulting from interleaving the sampling patterns in a given set (e.g., a time window) may produce an average k-t sampling density proportional to $1/k_r$, wherein $k_r$ is the distance from the center of the data space.

Figure 2:
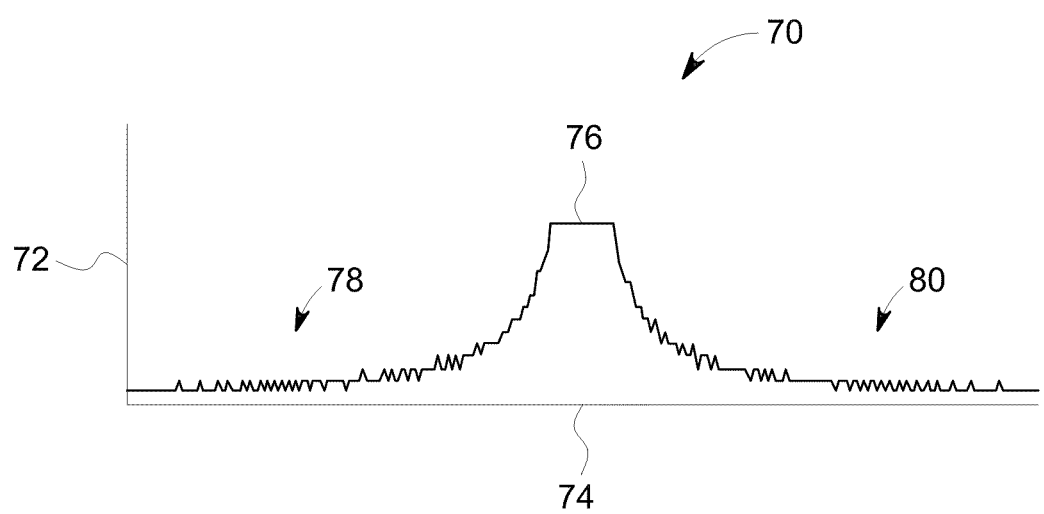
FIG. 2 is an illustration of an embodiment of a plot of sampling density versus data space position for undersampled data acquired using pseudo-random sampling patterns.

Such a sampling density may be further appreciated with reference to FIG. 2, which illustrates a plot 70 of sampling density 72 as a function of k-space (or hybrid space) position 74, wherein the bounds of the axis 74 represent the bounds of k-space or hybrid space (i.e., the field of view). The plot 70 includes a capped area 76 disposed (e.g., centered) about the origin of k-space (i.e., the center of k-space) bounded by a pair of trailing sections 78, 80. In some embodiments, the capped area 86 may have a value of about 1, with sections 78, 80 decreasing from a value of 1 with increasing distance from the area 76 (i.e., the center of k-space). The trailing sections 78, 80 generally represent a decreasing sampling density as the sampling locations move further from the center of k-space. In some embodiments, the sections 78, 80 may denote sampling densities following $1/k_r$, a function that is proportional to $1/k_r$, or any function that is dependent on $k_r$. In the illustrated embodiment, the sections 78, 80 are represented by $1/k_r$. In certain embodiments, undersampling within sections 78, 80 may be random, or may be defined by an inter-relationship between acquisitions. As an example, in embodiments where the undersampling pattern within sections 78, 80 in a single acquisition is not related to (i.e., is not dependent on) undersampling patterns in other acquisitions, such acquisitions may be considered to be non-interleaving. In embodiments where such an inter-relationship exists, such acquisitions may be considered as interleaving, as described in further detail below. However, it should be noted that both acquisitions may be considered pseudo-random.

In this way, the term "pseudo-random" may also refer to patterns in k-space or hybrid space that are determined for certain regions but random in others. For example, as described above with respect to FIG. 2, in certain embodiments a central region of k-space may be more fully sampled in all acquisitions (the dimensions of the region may be selected or programmed for a particular application), with other regions of k-space being randomly sampled. In certain of these embodiments, as noted above, the randomly sampled regions may have a sampling density that meets some constraint or predetermined relationship.

Figure 3:
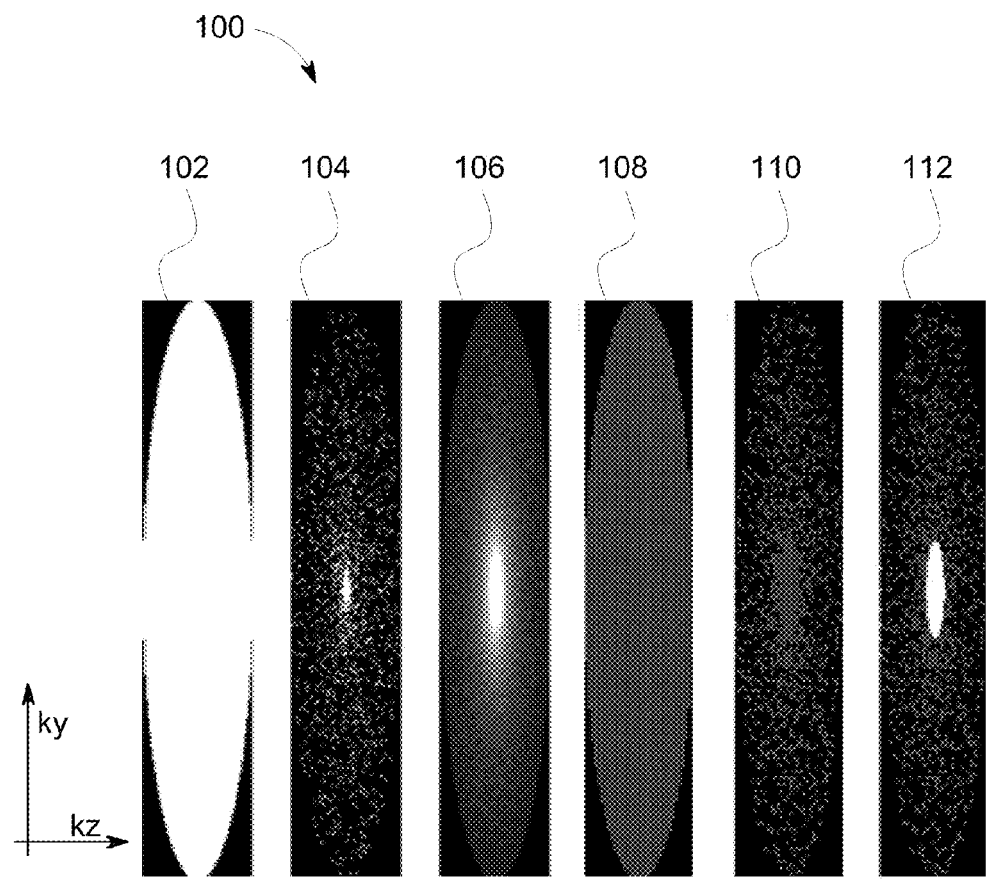
FIG. 3 is a combined illustration of an embodiment of a series of Cartesian k-space data plots having variable sampling densities.

To facilitate the introduction of the present acquisition sequences, FIG. 3 illustrates a series of Cartesian k-space data plots 100, wherein varying densities of locations along the $k_y$ and $k_z$ axes of k-space are acquired in a given time frame. Of course, while the present embodiments are described in the context of k-space data, it should be noted that other data spaces are applicable, such as hybrid space data. Referring to FIG. 2, the series of plots includes a fully sampled data frame 102, which is a magnetic resonance data set acquired in k-space. More specifically, the fully sampled data frame 102 is a Cartesian set of data that meets the Nyquist criteria. The fully sampled data frame 102 has a generally (but not necessarily) ellipsoidal pattern of k-space sampling locations due to corner cutting, which is a technique for acquisition acceleration. It should be noted that while the presently contemplated embodiments are presently discussed in the context of performing such corner-cutting techniques, in some embodiments, corner cutting may not be used. In the fully sampled data frame 102, the data may be considered to be sampled in a uniform density, wherein every location is sampled once.

Figure 4:
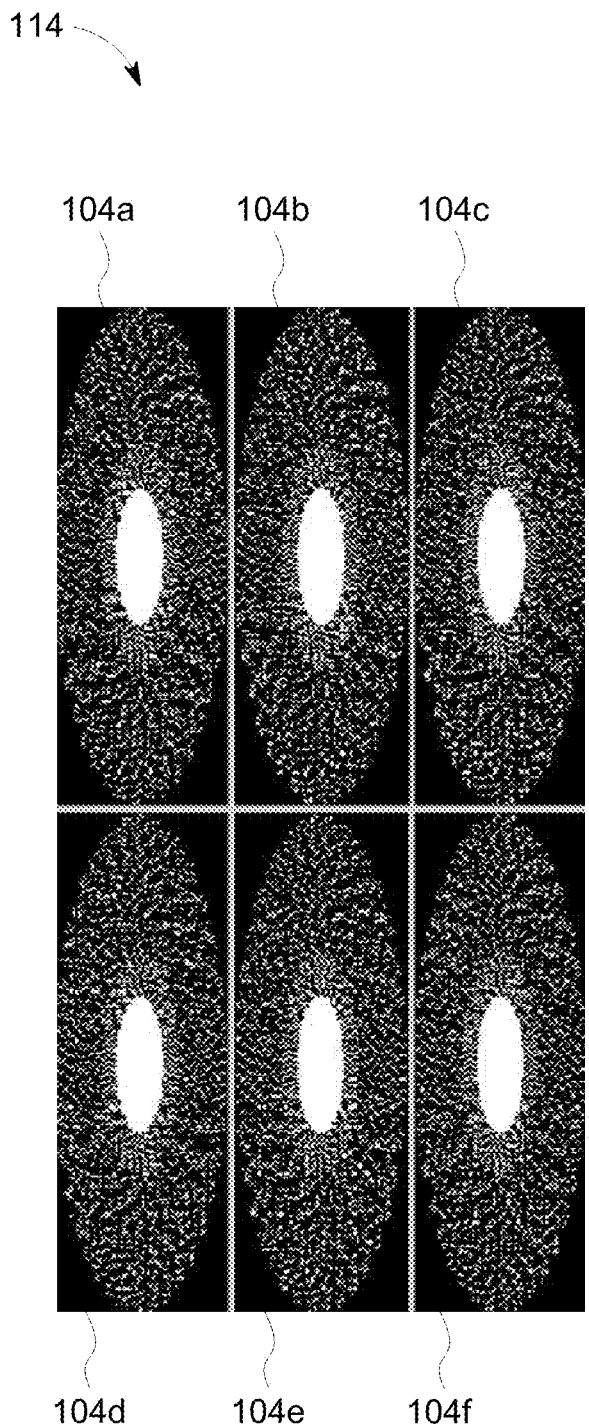
FIG. 4 is a combined illustration of a series of sparsely sampled data frames that interleave to form a desired pattern.

Adjacent to the fully sampled data frame 102 is a pseudo-randomly sampled data frame 104. The sampling density in the pseudo-randomly sampled data frame 104 increases closer to the center of k-space, and is defined by an area within the bounding of the ellipse similar to that of the fully sampled data frame 102. In the acquisition sequences described herein, a plurality of pseudo-randomly sampled data frames similar to pseudo-randomly sampled data frame 104 are acquired over a period of time, which is illustrated generally in FIG. 4 as described below. The patterns of the sampling locations of the pseudo-randomly sampled data frames interleave such that when combined (e.g., on a point-wise basis in k-space and time), they may result in a greater number of unique (i.e., distinct) points that are sampled at least once across the ellipse, which is represented as a combined data frame 106. Such acquisitions, as defined herein, may be considered interleaved variable density (IVD) sampling acquisitions. In one embodiment, the greater number of unique points may be sampled exactly once when the data frames are combined. That is, the interleaved data frames, when combined in such an embodiment, may form a pseudo-random pattern of locations that have been sampled (e.g., once across the combined frames), and locations that have been left unsampled. Additionally, in some embodiments, an area proximate the center of k-space, such as the area proximate the center of frame 104 and as represented by plot 80 of FIG. 2, may be sampled such that the sampling density is capped at 1 sample per time frame per location, with the sampling density decreasing to 1 sample every N time frames per location, with N time frames representing the number of time frames in a time window. In this way, the N time frames interleave to yield a desired sampling pattern.

In addition to performing WD sampling, the present embodiments may also be performed in conjunction with parallel imaging techniques, wherein uniform undersampling (as opposed to pseudo-random undersampling) is performed on the area within k-space. An example of a parallel imaging acquired data frame is illustrated in frame 108, which is provided to facilitate explanation of the manner in which parallel imaging and IVD sampling are combined. In a general sense, the acquisition approaches may be combined by defining locations that may be sampled and locations that are to be left unsampled using parallel imaging techniques, and performing IVD sampling onto those locations that are defined as able to be sampled. For example, the sampling locations that generate the pseudo-randomly sampled data frame 104 may be sampled on the pattern of frame 108. Accordingly, a data set having both a regularly spaced, uniform undersampling pattern and a pseudo-random sampling pattern may be generated, as represented by data frame 110. In some embodiments, data frames such as frame 110 may be produced by first performing parallel imaging (i.e., defining an area of the data space that is able to be sampled to locations that are sampled and locations that are not sampled), followed by acquiring, on the defined locations that are sampled, pseudo-randomly sampled data using the IVD sampling patterns. In some situations, it may be desirable to fully sample an area proximate the center of the data space. Such an embodiment is represented by data frame 112. It should be noted that in one embodiment, the size of the area may be dependent upon (e.g., inversely proportional to) the speed of the acquisition. In such an embodiment, one option to increase the rate of acquisition is to reduce the size of the fully sampled area in the center of the data space.

As noted above, FIG. 4 represents a series 114 of data frames 104a-104f that are acquired within a time window. The time window may be used for eventual reconstruction of the images of interest from the acquired data, and may be determined on a case-by-case basis depending on various imaging parameters. Generally, the number of time frames within the time window indicates the number of frames suitable to form a desired sampling pattern from the pseudo-randomly sampled locations. In one embodiment, the desired sampling pattern may be a uniform sampling pattern while in other embodiments, the desired sampling pattern may be an undersampled pattern having a desired sampling coverage conforming to a certain predetermined requirement. In the embodiment illustrated in FIG. 4, the time window includes six frames, which interleave to form a pattern similar to that of frame 106 of FIG. 3. It should be appreciated that the patterns of frames 104a-104f include centric or reverse-centric spiral patterns. Further, while the present embodiments are disclosed in the context of time series, the approaches described herein are applicable to any series of images wherein less than the total amount of data may be acquired for a given frame or set of data, such as at different parametric values including but not limited to: TI, TE, diffusion direction, diffusion strength, partial pressure of oxygen, chemical shift, and flip angle. In such cases, a parameter value p may be fixed within each pattern and vary by $\Delta p$ from pattern to pattern. In other embodiments, p may vary continuously over $\Delta p$ within the pattern. Over all patterns, in embodiments where p is fixed, the range of parameter values would be $\Delta P=(N-1)\Delta p$, where N is the number of frames collected in a range of interest.

Figure 5:
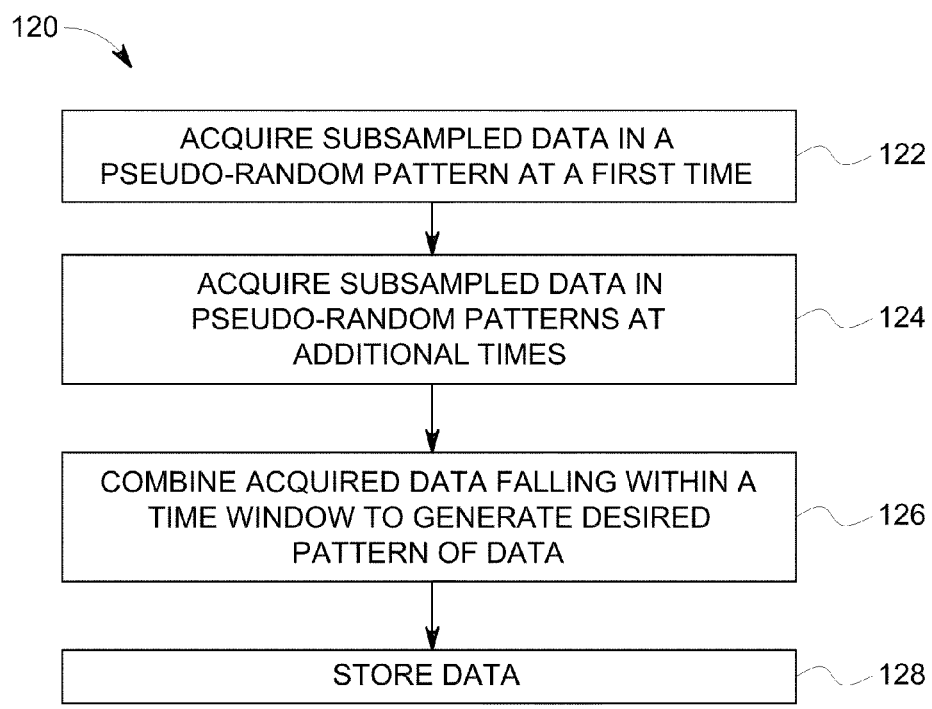
FIG. 5 is a process flow diagram of an embodiment of a method for performing interleaved variable density sampling acquisitions.

An embodiment of a general algorithm to perform an IVD sampling acquisition (e.g., to produce data frames similar to those described above with respect to FIG. 4) is illustrated as a process flow diagram in FIG. 5. Specifically, FIG. 5 illustrates a method 120 for acquiring an IVD set of data. The method 120 includes acquiring a set of subsampled data at a first time, the subsampled data being sampled in a pseudo-random fashion (block 122). It should be noted that a "first time" is only intended to note a first time with respect to FIG. 5, and that other data sets may be acquired prior to performing the acts represented by block 122. That is, the first time frame is intended to denote a given time frame of interest. For example, other pseudo-randomly sampled data sets may be acquired prior to performing the acts of block 122. In another example, in embodiments where parallel imaging is combined with the IVD sampling, regular undersampling due to parallel imaging may be performed prior to performing the acts of block 122. That is, prior to performing the acts of block 122, the area of the data space to be pseudo-randomly subsampled may be defined to locations that may be sampled and locations that are not to be sampled during IVD (or other pseudo-random) acquisitions.

After the acts of block 122 have been performed, additional sets of subsampled data are acquired, the subsampled data being sampled in a pseudo-random fashion (block 124). In embodiments wherein the acquisition is an IVD acquisition, each of the pseudo-random subsampling patterns is dependent upon at least one other pseudo-random subsampling pattern within the acquisition time window. Again, the number of additional sets of data that are acquired is generally determined at least by the time window and the duration of the imaging sequence. As noted above, when combined via a combination function, the data sets interleave to generate a desired pattern, for example a more fully sampled pattern of data (block 126) (i.e., a pattern having a greater number of locations that are sampled than any one of the single data sets). In one embodiment, the combined data set includes a pre-defined area (e.g., outside of a fully sampled central region of the data space) where the sampled locations are sampled only once in the combined data set. The combination function that is used to generate the combined set of data may account for coil sensitivities, and may include an averaging function, an interpolation function, or an addition or weighted addition function, or any combination thereof. Additionally, the combination function or other subsequent processing functions may account for the sampling density of the combined data set and the data acquired in the time frame of interest. For example, in one embodiment, the sampling density may be described using the following equation:

$$D(k_y, k_z) = \sum_{t=1}^{N} s_t(k_y, k_z) \quad (1)$$

where $D(k_y,k_z)$ is the sampling density, t=1 represents the first time frame (i.e., a time frame of interest), N represents the total number of time frames with a given time window, and $s_t(k_y,k_z)$ represents the sampling locations acquired within each of the time frames. As an example of a combination function, a reconstruction operator may add the values of the locations that are sampled exactly once across all time frames, and may average the values of the locations that are sampled more than once (e.g., in embodiments where the sampling locations are not interdependent). As another example, an area proximate the center of k-space, which may be fully sampled, may be weighted during combination with the remaining data, as will be described below.

It should be noted that after the data has been acquired (e.g., in blocks 122 and 124), the data may either be further manipulated, such as by performing the acts represented by block 126, and stored on a memory circuit (block 128), or simply stored on the memory circuit (block 128). For example, in some embodiments, the data may be stored on memory 48 or memory 56 of the system 10 in FIG. 1, or on a remotely accessible memory disposed in another room or at another facility prior to or in lieu of further processing steps. That is, the acts of block 126 may be optional. Further, the data may optionally be accessed and reconstructed to form images that may have processing and/or diagnostic utility. Moreover, the acquisition method 120 described above may optionally include other acts, depending on the type of imaging that is performed. For example, for angiographic imaging, a pre-contrast mask image may be acquired. The mask data could be subtracted from all dynamic data (i.e., data acquired over a series of time frames) prior to applying the reconstruction algorithms described below.

Some reconstruction techniques that may be utilized with the disclosed embodiments of IVD sampling and pseudo-random sampling, as well as general Cartesian undersampling include algorithms capable of performing reconstruction on Cartesian samples of data. For example, the reconstruction algorithms described herein may include Cartesian-sampling manifestations of highly constrained back projection (HYPR) reconstruction and variants thereof, Multiplicative Algebraic Reconstruction Technique (MART), and so on. Furthermore, such reconstruction techniques may, in accordance with certain of the present embodiments, be combined with other acquisition and reconstruction methods, such as parallel imaging acquisition and reconstruction methods. Examples of various reconstruction embodiments are described in further detail hereinbelow with respect to FIGS. 6-8.

Generally, it is desirable to accelerate data acquisition to an extent that allows sufficient temporal and spatial resolution for the generation of high quality images. Accordingly, keeping in mind the approaches described above, it may be desirable to combine the acquisition and reconstruction steps of parallel imaging with IVD acquisition, and, in embodiments, other reconstruction techniques as described in detail below. The parallel imaging techniques that may be utilized in accordance with present embodiments include parallel imaging in the k-space domain (e.g., GRAPPA), in the hybrid-space ($x$-$k_y$-$k_z$) domain (e.g., ARC), or in the image space domain (e.g., SENSE). Therefore, while certain of the methods described below may be presented in the context of k-space or hybrid space, they are intended to encompass reconstruction in either or both. Moreover, the inventors have found, surprisingly, that parallel reconstruction assuming uniformly-sampled data (e.g., assuming a uniform undersampling pattern) may be performed to generate one or more diagnostically- and statistically-useful images even though the data used for such reconstruction is not uniformly sampled. Rather, the data used for parallel imaging reconstruction in accordance with the disclosed embodiments is pseudo-randomly sampled (i.e., the data used for reconstruction includes a non-uniform pattern wherein certain locations are sampled and other locations are not sampled) on a pre-defined uniform area. Generally, the parallel imaging methods described herein may be performed on a variety of pseudo-random sampling acquisitions, such as the IVD acquisitions described above as well as pseudo-random sampling patterns wherein the sampling patterns include areas of the data space wherein sampling locations are defined, and other locations wherein sampling is random (i.e., pseudo-random sampling patterns that do not necessarily interleave to generate a desired sampling pattern).

Additionally, while the certain of the present embodiments provide data undersampling methods such as the IVD acquisitions described above, non-interleaving pseudo-random acquisitions, and so forth, certain of the reconstruction methods described herein may be generally applicable to under-sampled sets of Cartesian data. For example, certain of the reconstruction embodiments described herein are generally configured to operate on sparsely sampled data sets that have undersampling along the phase encoding axes of a data space. Therefore, the Cartesian-based reconstruction methods described herein are also applicable, in addition to IVD/ pseudo-random acquisitions, to time resolved imaging of contrast kinetics (TRICKS) acquisitions, time resolved projection sampling with three-dimensional (3D) Cartesian phase and slice encoding (TRIPPS) acquisitions, Cartesian acquisition with projection reconstruction-like (CAPR) acquisitions, and so on.

Figure 6:
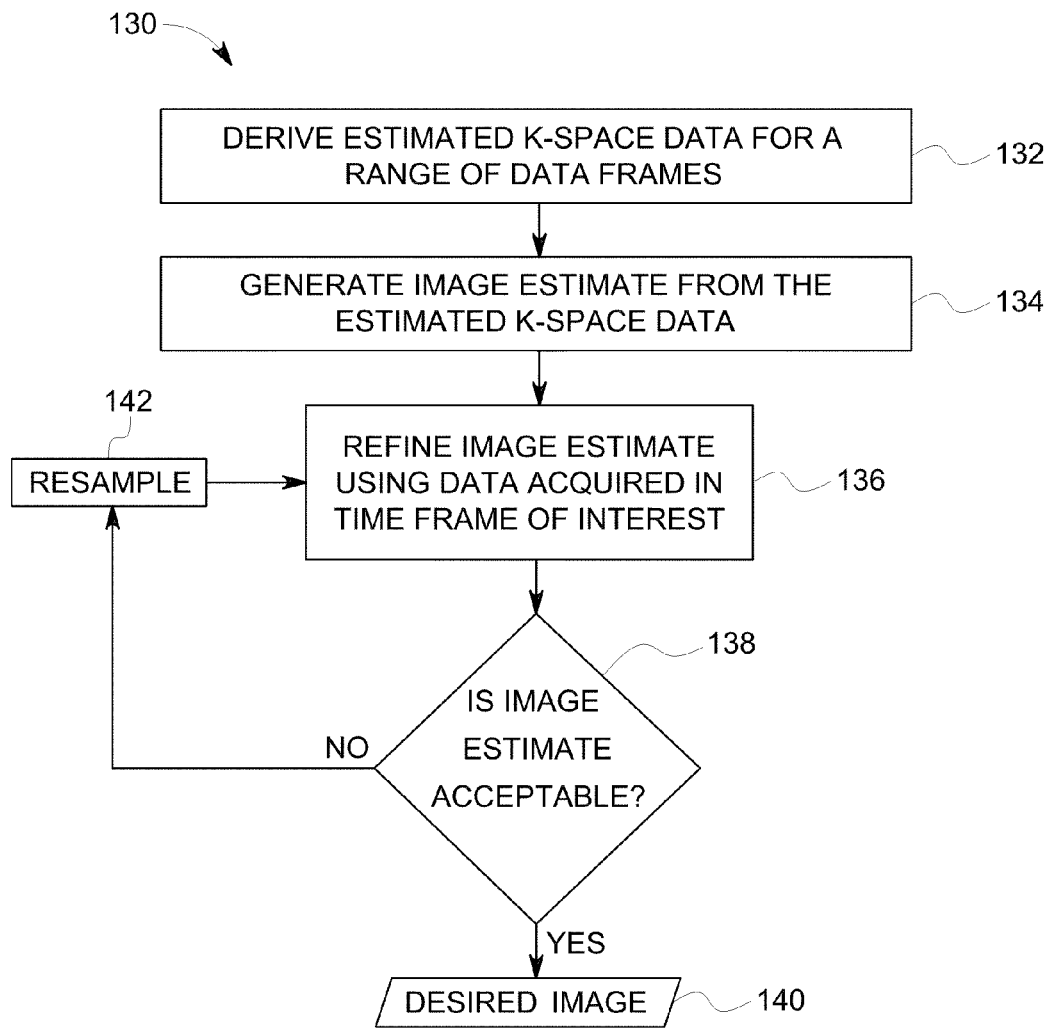
FIG. 6 is a process flow diagram of an embodiment of a general method for performing image reconstruction using data acquired in one or more pseudo-random sampling patterns.

FIG. 6 illustrates a process flow diagram of a generalized method 130 for generating a desired image from a k-space data set of sparsely undersampled data. As an example, the sparsely sampled data may include the set of data generated from performing the method 120 of FIG. 5 with or without parallel imaging undersampling, pseudo-random subsampling with or without parallel imaging undersampling, and so on. Additionally, as mentioned above, method 130 is also applicable to the reconstruction of any such Cartesian set of data (e.g., a k-space or hybrid space data set) that is undersampled. For example, the undersampled set of data may or may not interleave to generate a desired sampling pattern, and may or may not have a pseudo-random sampling pattern. Method 130 includes deriving estimated k-space data, referred to herein as $K_{est}$, for a range of time frames (block 132). The range may include data collected over two or more time frames such as data collected over N time frames. In a general sense, the N time frames define a time window, and may be determined on an individual basis for each data set to be reconstructed. Further, the data may be derived using a combination function, such as a function that averages the k-space data over the range of time frames, adds the data, interpolates the non-sampled locations using the range of time frames, or any combination thereof. Using the estimated k-space data from block 132 ($K_{est}$), an image estimate is generated (block 134), which may be referred to as $I_{est}$. In embodiments where no parallel imaging is performed, a Fourier operation (e.g., a fast Fourier transform (FFT)) may transform the acquired data into $I_{est}$.

In other embodiments, such as when parallel imaging acquisition is used to define the sampled area, $I_{est}$ may be generated using parallel imaging reconstruction, which may include ARC reconstruction in combination with a Fourier operation in hybrid space embodiments. In some embodiments, the parallel imaging reconstruction may suppress coherent aliasing artifacts (i.e., wrapping artifacts), with incoherent artifacts (i.e., non-wrapping artifacts) being addressed by certain of the multiplicative constraint reconstruction embodiments described herein. As noted above, those of skill in the art will appreciate that the ability to generate $I_{est}$, an image that may have diagnostic and processing utility, from a non-uniformly sampled data set using parallel imaging reconstruction is rather surprising. For example, the parallel imaging reconstruction kernel (e.g., the ARC kernel) may assume that the non-uniformly sampled data set is uniformly sampled (i.e., the ARC kernel is calibrated for a uniform pattern).

After the initial image formation, $I_{est}$ is then refined using the data that was acquired in the time frame of interest (block 136). The data may be referred to as $k_t$, or the k-space data acquired at time t, with the updated image estimate being referred to as $I'_{est}$, the prime indicating that an update has been performed. Once the initial image estimate has been refined at least once (block 136), the method 130 may end. However, in some embodiments it may be desirable to reiterate the refining steps. Accordingly, a query is performed as to whether the new image estimate is acceptable (query 138). In embodiments where a desired image is produced (data 140), the method 130 may stop. However, in embodiments where further refining is suitable, the updated estimate may be resampled (block 142), with the acts of block 136 and query 138 being repeated until the desired image 140 is produced.

Figure 7:
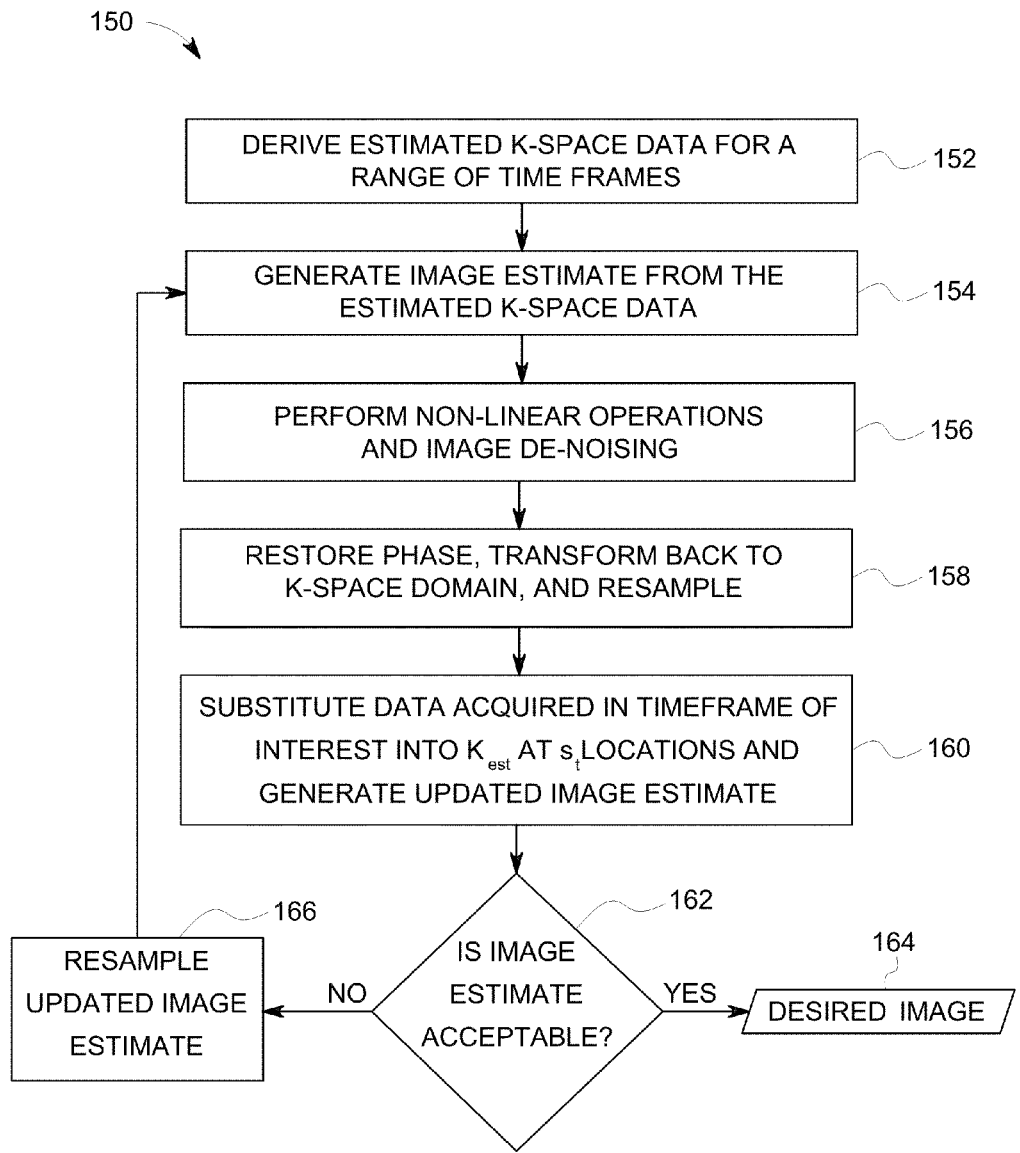
FIG. 7 is a process flow diagram of an embodiment of a method for performing image reconstruction in k-space using data acquired in one or more pseudo-random sampling patterns.
Figure 8:
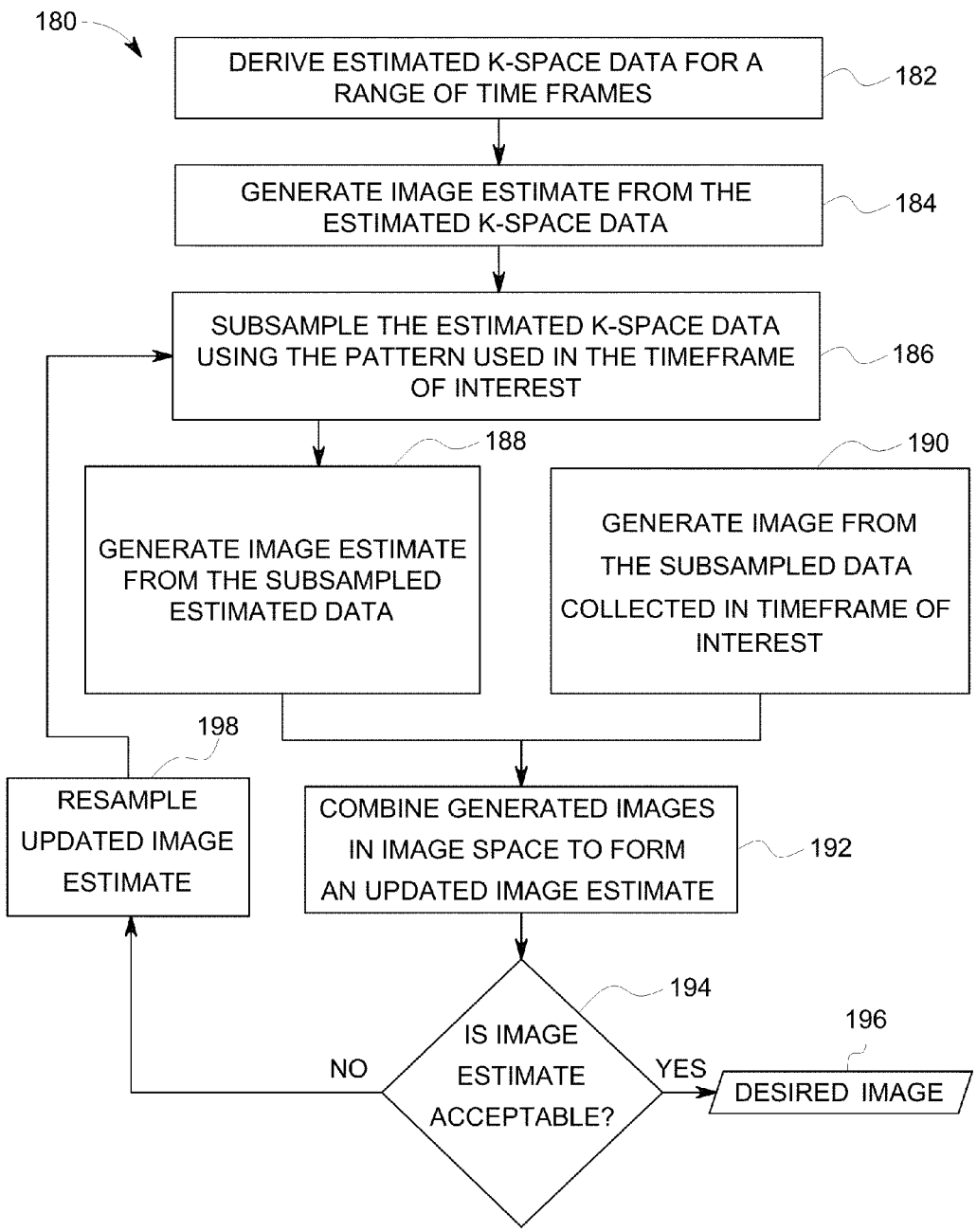
FIG. 8 is a process flow diagram of an embodiment of a method for performing image reconstruction in image space using data acquired in one or more pseudo-random sampling patterns.

It should be noted that the Cartesian-based reconstruction process described above may include processes performed only in k-space/hybrid space or in k-space/hybrid space and image space. FIG. 7 illustrates an embodiment where the reconstruction is performed using k-space and/or hybrid space operations, with FIG. 8 illustrating an embodiment where the reconstruction is performed in k-space/hybrid space and image space. Specifically, FIG. 7 illustrates a method 150 wherein k-space data is directly substituted into an estimated k-space data set to generate updates. Method 150 begins with deriving estimated k-space data for a range of sparsely sampled data frames (block 152). For example, the k-space data acquired in a range of time frames may be combined to form $K_{est}$. In some embodiments, $K_{est}$ may be corrected for one or more attributes of the collected data. A non-limiting example of such a combination function is provided below:

$$\overline{K}_t(k_y, k_z) = \frac{1}{D(k_y, k_z)} \sum_{t'=t-a}^{t+b} K_{t'}(k_y, k_z) \qquad (2)$$

where $\overline{K}_t(k_y,k_z)$ is $K_{est}$ corrected for sampling density, t-a is one bound of the time window, t+b is the other bound of the time window, and $K_{t'}(k_y,k_z)$ is k-space data collected at each time frame. In some embodiments, the time window may be a sliding window that is determined for each time frame of interest.

Once the k-space data has been estimated (e.g., to produce $K_{est}$ or $\overline{K}_t(k_y,k_z)$), an image estimate is produced (block 154). As noted above, in embodiments where the sampled area of k-space has been pre-defined using parallel imaging undersampling, the image estimate may be produced using parallel imaging reconstruction (e.g., using an ARC reconstruction algorithm and an FFT). In embodiments where the sampled area is not pre-defined, the image estimate may be generated using an FFT. The image estimate may be referred to as $I_{est}$ or, if the data is density-corrected, $\overline{I}_t(k_y,k_z)$. In an example implementation, in embodiments where the sampled area of k-space is predefined using parallel imaging undersampling, calculation of a coil combination weighting function for ARC is performed once for the entire series from fully sampled data acquired at the beginning or end of the method 150 (e.g., a fully sampled central region in k-space). In other embodiments, the coil combination weighting function for ARC may be calculated once for each time frame. ARC synthesis is then applied every iteration prior to FFT in order to transform the data into the image estimate. If the initial image estimate is partial-Fourier, then a homodyne algorithm is used to form the initial image estimate. Non-linear operations, de-phasing, and noise reduction is then applied to the image estimate (block 156). As an example, an absolute value function is used to remove phase, and, in some embodiments, a denoising function may be performed (e.g., modest wavelet denoising).

Subsequent to the acts of block 156, the phase is restored, the image estimate is transformed back into the k-space domain, and is re-sampled (block 158). For example, phase is re-applied prior to FFT in order to re-sample k-space at the appropriate locations, for example those defined generally by the union of the sampling patterns in the time window. A phase map defining such an area need only be calculated once for the entire series, for example using the same data used to derive the coil sensitivities mentioned above. In embodiments where contrast agent is injected, phase may be affected by contrast arrival, in which case the phase map may be calculated for each time frame, but does not necessarily have to be recalculated for every update of the image estimate.

Once the re-sampling has been performed, the data acquired in the re-sampling, which may be the same as $k_t$, is then substituted into $K_{est}$ (or its corrected variant) at $s_t$ locations. The $s_t$ locations are the locations that are sampled within the timeframe of interest. Once the substitution has been performed, the updated image estimate is generated (block 160). In other words, at the locations (e.g., pseudo-random locations) that are sampled within the timeframe of interest, the re-sampled values are substituted back into $K_{est}$.

Upon generating the updated image estimate, a query is performed as to whether the image is acceptable (query 162). In embodiments where no further iterations are desired, a desired image is produced (data 164). In embodiments where parallel imaging undersampling and reconstruction have been performed, the algorithm described above is repeated for each coil, and, after iterating, a coil combination (e.g., a sum-of-squares coil combination) is performed on $I_{est}$ to create the final image (i.e., data 164) for each time frame. As noted above, such coil-by-coil driven reconstruction may suppress coherent aliasing artifacts. In embodiments where the image update may benefit from additional updates, the updated image estimate may be re-sampled (block 166) in the sampling locations $s_r$ until the image estimate is determined to be acceptable.

As noted above, the general method for reconstruction depicted in FIG. 6 may be performed at least partially in image space. An embodiment of such an image reconstruction method is illustrated with respect to FIG. 8, which is a process flow diagram of a method 180 for generating a desired image (e.g., a diagnostically and/or processing-useful image) from a series of intermediate image estimates. For example, a first, a second, and a third image may be combined using a Cartesian reconstruction method similar to HYPR and MART. In the method 180, estimated k-space data is derived for a range of time frames and, in some embodiments, may be density-corrected to generate $\overline{K}(k_y, k_z)$ (block 182). In the acts represented by block 182, correction for the k-t sampling density ($D(k_y,k_z)$) may be performed so that the "holes" (data not sampled in a given time frame) do not cause the center of k-space to be weighted more heavily during data combination, which would cause blurring.

An image estimate, $I_{est}$, is generated from $\overline{K}_t(k_y,k_z)$. For example, $I_{est}$ may be generated by performing an FFT, or, in some embodiments, using parallel imaging reconstruction (block 184). In embodiments where no parallel imaging is performed, the image estimate $I_{est}$ may be formed by performing an FFT, followed by an optional phase removal procedure. In some embodiments, $I_{est}$ may be an image that is substantially free of spatial blurring due to the estimation of the non-sampled locations in k-space. However, $I_{est}$ may have temporal blurring due to the combination of data over multiple time frames.

Upon generating $L_s$, it is subsampled at locations defined by the pattern $s_r$ that is sampled for the timeframe of interest to generate a subsampled set of estimated data, $K_{est}^s$ (block 186). For example, the subsampling pattern may be a TRICKS, TRIPPS, CAPR, IVD, pseudo-random, or other pattern used for the acquisition of the data in the timeframe of interest. In this regard, $K_{est}^s$ may be considered to be density- and location-corrected. Using $K_{est}^s$, a new image estimate is generated to give $I_{est}^s$ (block 188). For example, in embodiments where parallel imaging undersampling and reconstruction are utilized, the ARC algorithm may be used for parallel imaging reconstruction. Again, the parallel imaging reconstruction algorithm (e.g., the ARC kernel) is generated by calibrating for a uniform undersampling pattern rather than the non-uniform undersampling pattern defined by certain of the acquisitions described herein (i.e., the IVD-random or otherwise pseudo-random undersampling), which results in image reconstruction. Thus, it is believed that the ARC kernel operates on zeroes where data are missing due to irregular sub-sampling (e.g., from the IVD or non-interleaving pseudo-random subsampling). However, for locations that are not sampled by the subsampling performed in block 186, no synthesis takes place (zeroes remain there). Optionally, image phase is removed and a positive-real constraint is applied to remove some noise and incoherent aliasing (i.e., non-wrapping artifacts) that arise in embodiments having irregular sub-sampling.

In addition to the acts described above, the method 180 includes generating an image, $I_t$, from the subsampled data collected in the time frame of interest (e.g., from block 122 in FIG. 5) (block 190). Again, in embodiments using parallel imaging sampling and reconstruction, the ARC kernel operates on zeroes where data are missing due to sub-sampling. No synthesis may take place for locations that are not pseudo-randomly subsampled. If also performed above, image phase is removed and a positive-real constraint is applied to remove some noise and incoherent aliasing that may arise in embodiments having irregular sub-sampling. Moreover, it should be noted that image $I_t$ is generated from data acquired in a single time frame, and is therefore substantially free of temporal blurring.

Once $I_t$, $I_{est}$, and $I_{est}^s$ have been generated, they are combined using an image-based back projection (i.e., HYPR, MART) (block 192). For example, in one embodiment, the combination of the three images may be represented by the following equation:

$$I'_{est} = I_{est} \frac{I_t + c}{I_{est}^s + c} \qquad (3)$$

where $I_{est}'$ denotes an updated image estimate. A small constant, having a value of c>0 may improve stability in the reconstruction algorithm.

Once the updated estimate is produced, a determination is made as to whether the image estimate is acceptable (query 194). In embodiments where no further iterations are desired, a desired image is produced (data 196). In other embodiments, such as where an update to the image estimate may be desirable, the updated image estimate, $I_{est}'$, may be phase-restored and re-sampled (block 198) and the acts of blocks 186-192 re-iterated.

Technical effects of the present disclosure include improved image processing and acquisition techniques. For example, by performing IVD subsampling, incoherent spatial artifacts in diagnostic images may be reduced. In accordance with certain of the disclosed embodiments, parallel imaging and IVD sampling may be performed to undersample data within k-space and achieve a temporal-spatial acceleration of more than 20-fold. Furthermore, the inventors have found, rather surprisingly, that parallel imaging reconstruction, which is implemented by calibrating for a uniform sampling pattern, may be used to construct an image from a set of data having a non-uniform sampling pattern. The non-uniform sampling pattern may result from any one, a combination, or a variation of the IVD subsampling embodiments described herein.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A magnetic resonance imaging method, comprising:
performing a magnetic resonance imaging data acquisition of a subject of interest to obtain a set of magnetic resonance data;
performing parallel imaging reconstruction on the set of magnetic resonance data to generate an initial image, the set of magnetic resonance data comprising data acquired in a time frame of interest and having a non-uniform sampling pattern on a predefined area of a data space; and
storing and displaying the initial image.

2. The method of claim 1, wherein the predefined area of the data space comprises a uniform pattern of locations that are to be sampled and locations that are not to be sampled.

3. The method of claim 2, wherein the non-uniform sampling pattern comprises a pseudo-random sampling pattern having locations towards the center of the data space that are sampled with greater frequency than those further from the center of the data space.

4. The method of claim 1, wherein the patterns are along the phase encoding axes of k-space or hybrid space.

5. The method of claim 1, wherein performing parallel imaging reconstruction comprises performing parallel imaging reconstruction on a coil-by-coil basis to suppress aliasing artifacts, and the parallel imaging reconstruction is calibrated for the uniform sampling pattern.

6. The method of claim 5, comprising:
performing one or more additional acquisition sequences at respective time frames to acquire one or more additional sets of magnetic resonance data having respective pseudo-random data undersampling patterns on the predefined area; and
performing back projection reconstruction to generate a reconstructed image for the time frame of interest using the set of magnetic resonance data and the additional sets of magnetic resonance data.

7. The method of claim 6, wherein the initial image is used for processing during the back projection reconstruction.

8. The method of claim 7, wherein performing the back projection reconstruction comprises:
generating a temporally blurred image substantially free of spatial blurring from a combined set of magnetic resonance data, wherein the combined set of magnetic resonance data is generated using a combination function to combine the set of magnetic resonance data acquired in the timeframe of interest and the additional sets of magnetic resonance data;
generating a location-corrected image from the combined set of magnetic resonance data and the sampling pattern of the set of magnetic resonance data; and
generating the reconstructed image using the image using the initial, the temporally blurred, and the location-corrected images.

9. The method of claim 8, wherein generating the temporally blurred image comprises correcting the combined set of magnetic resonance data for the sampling density of the combined set of data.

10. The method of claim 9, wherein generating the location-corrected image comprises sampling the temporally blurred image at the pseudo-random locations of the set of magnetic resonance data acquired in the timeframe of interest.

11. The method of claim 6, wherein performing the back projection reconstruction comprises suppressing incoherent image artifacts by using the temporally blurred image as a multiplicative constraint.

12. A magnetic resonance imaging method, comprising:
performing a magnetic resonance acquisition sequence comprising:
defining a uniform undersampling pattern comprising locations that are to be sampled and locations that are to be left unsampled on at least a portion of a phase encoding plane of a data space;
acquiring an undersampled set of magnetic resonance data representative of a feature of a subject of interest using a non-uniform undersampling pattern on the defined uniform undersampling pattern; and
generating an image based upon the undersampled set of magnetic resonance data for storage and display.

13. The method of claim 12, wherein the non-uniform sampling pattern comprises a pseudo-random undersampling pattern.

14. The method of claim 13, wherein the data space is k-space or hybrid space, and the pseudo-random sampling pattern comprises locations towards the center of the data space that are sampled with greater frequency than those further from the center of the data space.

15. A magnetic resonance imaging method comprising:
performing a magnetic resonance imaging data acquisition of a subject of interest to obtain an undersampled set of magnetic resonance data;
performing multiplicative constrained reconstruction on the undersampled set of magnetic resonance data acquired within a timeframe of interest to generate a desired image;
wherein the data comprises an undersampling pattern having locations that are sampled and locations that are not sampled along a phase encoding plane of a data space.

16. The method of claim 15, wherein the undersampling pattern is generated using a TRIPPS acquisition, a TRICKS acquisition, a CAPR acquisition, or any combination thereof.

17. The method of claim 15, wherein undersampling pattern comprises a pseudo-random sampling pattern.

18. The method of claim 17, wherein the pseudo-random sampling pattern is dependent upon at least one other pseudo-random sampling pattern from one or more additional undersampled sets of magnetic resonance data.

19. The method of claim 17, wherein the data comprises a predefined uniform sampling pattern on which the pseudo-ranodm sampling pattern is disposed, the predefined uniform sampling pattern comprising a uniform pattern of sampling locations within the data space that are able to be sampled using the pseudo-random sampling pattern and locations that are not able to be sampled using the pseudo-random sampling pattern.

20. The method of claim 19, comprising performing parallel imaging reconstruction prior to performing multiplicative constrained reconstruction.

21. The method of claim 15, wherein the multiplicative constrained reconstruction comprises:
- generating a first image from the undersampled magnetic resonance data set acquired in the time frame of interest, the first image being substantially free of temporal blurring;
- generating a second image substantially free of spatial blurring generated from a combined set of magnetic resonance data, the combined set of magnetic resonance data comprising the undersampled magnetic resonance data set acquired in the time frame of interest and at least one additional undersampled magnetic resonance data set acquired in at least one additional time frame; and
- generating a third image from location-corrected data, and the location corrected data is generated by sampling the combined set of magnetic resonance data using the undersampling pattern of the undersampled magnetic resonance data set acquired in the time frame of interest.

22. The method of claim 21, comprising:
- generating the desired image by dividing the first image by the third image and applying a multiplicative constraint, the multiplicative constraint comprising the second image.

* * * * *